(12) United States Patent
Tsuda (10) Patent No.: US 7,996,117 B2
(45) Date of Patent: Aug. 9, 2011

(54) MRI SYSTEM EMPLOYING SUPERCONDUCTING MAGNET AND ITS MAINTENANCE METHOD

(75) Inventor: Munetaka Tsuda, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 270 days.

(21) Appl. No.: 12/093,374

(22) PCT Filed: Nov. 21, 2006

(86) PCT No.: PCT/JP2006/323224
§ 371 (c)(1),
(2), (4) Date: May 12, 2008

(87) PCT Pub. No.: WO2007/060950
PCT Pub. Date: May 31, 2007

(65) Prior Publication Data
US 2009/0254227 A1 Oct. 8, 2009

(30) Foreign Application Priority Data
Nov. 25, 2005 (JP) .................................. 2005-340060

(51) Int. Cl.
*G05D 23/00* (2006.01)
*G05D 16/00* (2006.01)
(52) U.S. Cl. ....................................... 700/300; 700/301
(58) Field of Classification Search .................. 700/300, 700/301
See application file for complete search history.

(56) References Cited

U.S. PATENT DOCUMENTS

| 6,828,889 B1 * | 12/2004 | Zaput ............................. 335/216 |
| 2002/0020174 A1 | 2/2002 | Kruip ................................ 62/3.3 |
| 2002/0130662 A1 | 9/2002 | Munetaka ...................... 324/318 |
| 2005/0109049 A1 * | 5/2005 | Chan ............................... 62/129 |

FOREIGN PATENT DOCUMENTS

| JP | 1-110356 | 4/1989 |
| JP | 6-69030 | 3/1994 |
| JP | 2002-119493 | 4/2002 |
| JP | 2002-336216 | 11/2002 |
| JP | 2005-5574 | 1/2005 |

OTHER PUBLICATIONS

Machine translation of JP 06-069030 A.*

* cited by examiner

*Primary Examiner* — Ryan A Jarrett
(74) *Attorney, Agent, or Firm* — Cooper & Dunham LLP (57) ABSTRACT

There is provided an MRI system in which magnetostatic field can be stably generated by keeping the cooling capacity of a cryocooler in a proper range. The magnetic resonance imaging apparatus using a superconducting magnet (101) is equipped with a superconducting coil (201, 202), a container (203, 204) for accommodating the superconducting coil and refrigerant, a cooling unit (208) for liquefying vaporized gas of the refrigerant in the container again, a pressure detector (215) for detecting the pressure in the container, a heating unit (216) for heating in at least one of the cooling unit and the container, a controller (127) and a computer (114). The controller (127) controls the heat value of the heating unit (216) in accordance with the pressure detected by the pressure detector (215). The computer (114) judges by using the heat value of the heating unit (216) whether maintenance of the cooling unit should be performed or not.

18 Claims, 9 Drawing Sheets

MRI SYSTEM EMPLOYING SUPERCONDUCTING MAGNET AND ITS MAINTENANCE METHOD

TECHNICAL FIELD

The present invention relates to a magnetic resonance imaging (MRI) apparatus using a superconducting magnet, and particularly to an MRI apparatus having a cryocooler.

BACKGROUND ART

An MRI apparatus for taking a medical diagnosis image from a nuclear magnetic resonance (NMR) signal can obtain not only morphological images, but also images of the functions and metabolism of living bodies, and has an excellent function of detecting the seat of a disease.

An MRI apparatus using a superconducting magnet having an open structure disclosed in Patent Document 1 has a feature that the magnetic field intensity is uniform and strong, and also the space in the magnet in which an object is disposed brings a bright and open impression.

However as compared with a cylindrical superconducting magnet, in the superconducting magnet having the open structure, the number of support mechanisms for superconducting coils mounted in a cryostat is large and the surface area of the cryostat is also large, so that heat frequently immerses into the cryostat.

Therefore, Patent Document 2 discloses that a heat shield plate for shielding radiation heat from the outside is installed in a multiple style in the cryostat, and also a cryocooler having a cooling capacity for re-cooling vaporized helium gas to its boiling point or less so that the vaporized helium gas is returned to liquid helium is secured to the cryostat.

The cooling capacity of the cryocooler is lowered due to abrasion of movable portions, accumulation of impurities, etc. with lapse of the operation time. However, it is a required condition that it keeps the cooling capacity for reducing helium to the boiling point (4.2 Kelvin temperature) or less, and thus it is necessary to perform a maintenance work to keep and recover the cooling capacity.

Ordinarily, the maintenance work of the cryocooler is carried out every time an operation time of about 10,000 hours elapses, and a filtering unit of a helium compressor connected to the cryocooler is exchanged every about 20,000 hours. An operator checks the time displayed on an integrating operation time indicator provided to the helium compressor, thereby managing the operation time of the cryocooler.

The integrated operation time indicator of the helium compressor is effective to grasp an accurate operation time excluding a time for which the apparatus is stopped due to power outage or the like, and thus there is an advantage that it is possible to synchronously perform the maintenance work on the cryocooler every about 10,000 hours and on the helium compressor every about 20,000 hours by performing the management on the basis of the above time.

Furthermore, Patent Document 3 discloses a superconducting magnet in which a pressure sensor and a heater are disposed in a helium tank having a cryostat mounted therein. In this construction, when the pressure sensor detects that the pressure in the helium tank is set to negative pressure with respect to the ambient pressure, the heater is heated in the helium tank to evaporate liquid helium, whereby the pressure in the helium tank is controlled not to be set to the negative pressure.

Patent Document 1: JP-A-2002-336216
Patent Document 2: JP-A-2005-237417
Patent Document 3: JP-A-6-283329

However, in the performance of the cryocooler, in actual practice some degree of dispersion exists within the duration of the cooling capacity among respective units, and in the case of a cryocooler whose cooling capacity reduces within 10,000 hours and is required to be subjected to maintenance, the execution of the maintenance is delayed.

The function of the cryocooler is to cool helium gas to its boiling point or less so that it is returned to liquid helium. Accordingly, even when degradation of the cooling capacity varies continuously and gently, it cannot liquefy helium at the point in time when the cooling capacity is degraded from the boiling point of helium of 4.2 Kelvin temperature slightly by 0.1°, and thus the cryostat consumes a large amount of helium suddenly.

In the subject matter of Patent Document 3 described above, the pressure in the cryostat can be controlled not to be set to the negative pressure by heating the heater in the cryostat. However, when degradation of the cooling capacity of the cryocooler progresses faster than expected, it would be impossible to detect the degradation concerned, and thus the maintenance timing cannot be judged.

Therefore, it is considered that the maintenance timing of the cryocooler is set to a time shorter than 10,000 hours, without variation. However, as described above, the cooling capacity of the cryocooler has some dispersion every unit, and the maintenance work must be executed on even a cryocooler which keeps sufficient cooling capacity. Therefore, this is undesirable.

BRIEF SUMMARY

An object of the present invention is to provide In an aspect of this disclosure, there is provided an MRI apparatus that can properly judge the cooling capacity of a cryocooler and a method of maintaining the MRI apparatus.

In another aspect, there is provided a magnetic resonance imaging apparatus that comprises: a cooling unit for cooling and liquefying gas of gasified refrigerant in a container in which superconducting coils are accommodated together with refrigerant; a pressure detector for detecting the pressure in the container; a heating unit disposed in the cooling unit or the heating unit; a controller for controlling a heat value of the heating unit in accordance with the pressure detected by the pressure detector and controlling the pressure in the container; and a judging unit for judging on the basis of the heat value whether the cooling unit should be maintained or not.

In another aspect, there is provided a method for maintaining a magnetic resonance imaging apparatus which comprises: detecting the pressure in a container in which superconducting coils of a superconducting magnet and refrigerant are accommodated; heating a heating unit disposed in a cooling unit or the container with a heat value corresponding to the detected pressure to control the pressure in the container; and judging on the basis of the heat value whether the cooling unit should be maintained or not.

A computer program for judging whether a cooling unit should be maintained or not in a magnetic resonance imaging apparatus comprising a container for accommodating superconducting coils and refrigerant together, a cooling unit for cooling the refrigerant in the container; a pressure detector for detecting the pressure in the container; a heating unit disposed in the cooling unit or the container, and a controller for controlling the heating value of the heating unit in accordance with the pressure detected by the pressure detector, comprises: graphing a time-variation of the heating value of the heating unit, calculating a rate of deviation between the graphed pattern and a predetermined normal pattern and judging whether the cooling unit should be maintained.

Accordingly, there can be implemented an MRI apparatus that can properly judge the cooling capacity of a cryocooler and a method of maintaining the MRI apparatus.

In addition, there can be implemented a computer program for an MRI apparatus that can properly judge the cooling capacity of a maintained cryocooler.

DESCRIPTION OF REFERENCE NUMERALS

101 . . . superconducting magnet, 102 . . . object, 103 . . . upper cryostat, 104 . . . lower cryostat, 105 . . . joint pipe, 106 . . . cryocooler, 108 . . . gradient magnetic field coil, 110 . . . high-frequency coil, 118 . . . filter circuit, 201, 202 . . . superconducting coil, 203, 204 . . . helium container, 207 . . . first stage, 208 . . . second stage, 209 . . . heat shielding plate, 210 . . . vapor stock pipe, 211 . . . vacuum container, 311 . . . indium wire

BEST MODES FOR CARRYING OUT THE INVENTION

Embodiments of the present invention will be described with reference to the accompanying drawings. In all the figures for describing the embodiments of the present invention, elements having the same functions are represented by the same reference numerals, and the repetitive description thereof is omitted.

Figure 1:
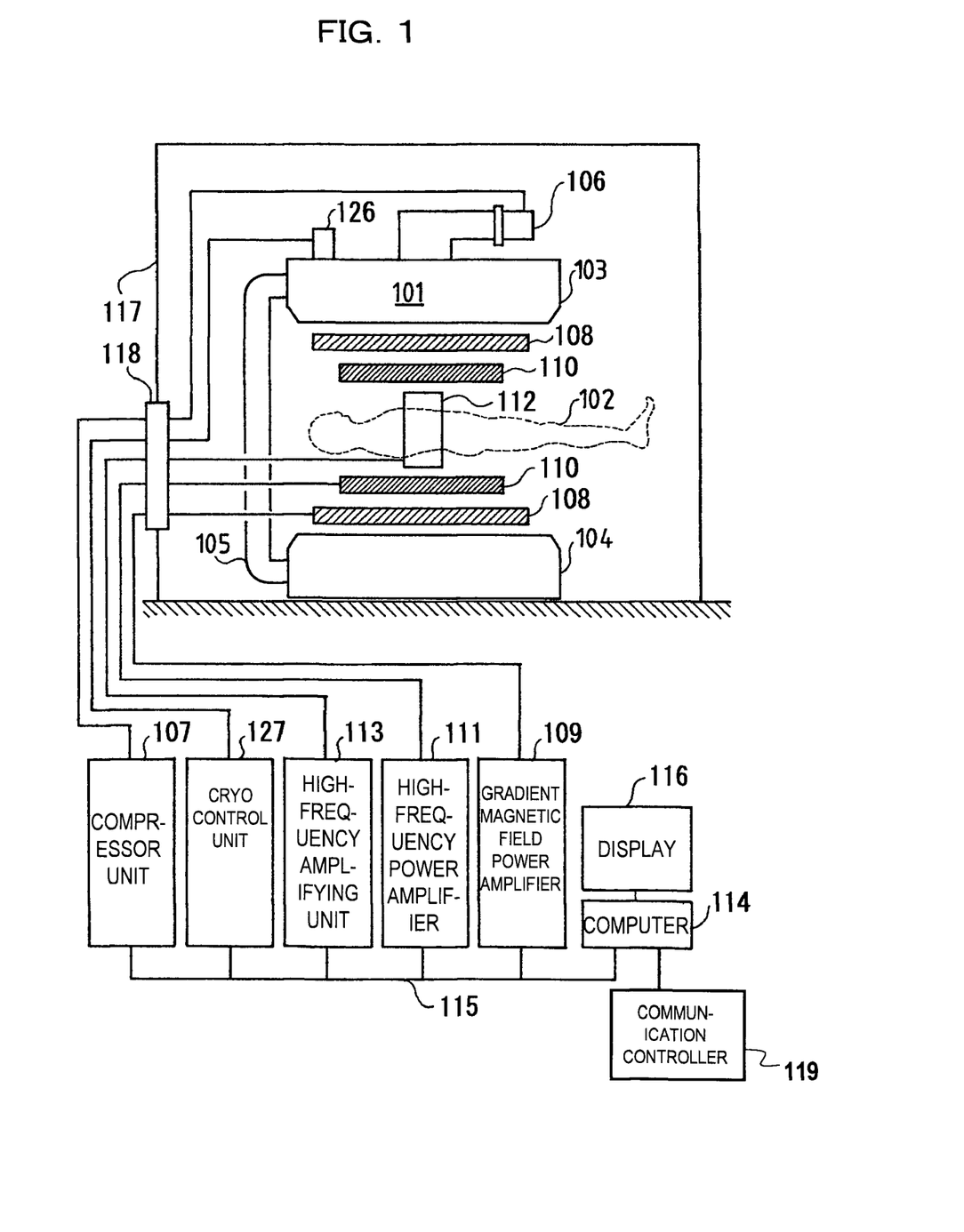
FIG. 1 is a diagram showing the overall construction of an open MRI apparatus to which a first embodiment of the present invention is applied.

FIG. 1 is a diagram showing the overall construction of an open MRI apparatus to which a first embodiment of the present invention is applied. As shown in FIG. 1, the open MRI apparatus is equipped with a superconducting magnet 101 having an open structure for generating a statistic magnetic field in an imaging space in which an object 102 is disposed, a cryocooler 106 for re-cooling refrigerant (helium) of the superconducting magnet 101 to its boiling point or less, a gradient magnetic field coil 108 for applying a gradient magnetic field to the imaging space, a high-frequency coil 110 for irradiating a high-frequency magnetic field to the imaging space, and a detection coil 112 for detecting an NMR signal from the object 102. The superconducting magnet 101, the cryocooler 106, the gradient magnetic field coil 108, the high-frequency coil 110 and the detection coil 112 are covered by an electromagnetic shield 117.

Furthermore, the MRI apparatus is equipped with a compressor unit 107 for feeding compressed helium gas to the cryocooler 106, a cryo control unit 127 for controlling the pressure of cryostats 103 and 104 of the superconducting magnet 101, a high-frequency amplifying unit 113 for amplifying a detection signal of the detection coil 112, a high-frequency power amplifier 111 for supplying high-frequency current to the high-frequency coil 110, a gradient magnetic field power amplifier 109 for supplying driving current to the gradient magnetic field coil 108, a computer 114 for controlling the operations of the above units via a system signal line 115, and a display 116.

The compressor unit 107, the cryo control unit 127, the high-frequency amplifying unit 113, the high-frequency power amplifier 111, the gradient magnetic field power amplifier 109, the computer 114 and the display 116 are disposed at the outside of the electromagnetic shield 117, and connected to the constituent elements in the electromagnetic shield 117 via a filter circuit 118.

Furthermore, a communication controller 119 such as a modem, a LAN terminal or the like is connected to the computer 114, and the MRI apparatus can be remotely supervised via the computer 114.

The superconducting magnet 101 having the open structure has an upper cryostat 103 and a lower cryostat 104 disposed so as to sandwich the imaging space therebetween. Therefore, it is designed so that the front-and-back side and the right-and-left side of the imaging space are greatly opened. Each of the upper cryostat 103 and the lower cryostat 104 is designed to have a multilayered structure in which a vacuum container 211, a heat shield plate 209 and helium containers 203, 204 are disposed in this order from the outside as shown in FIG. 2.

The vacuum container 211 is formed of stainless steel of 15 mm in thickness. The gap between the vacuum container 211 and the helium container 203, 204 is made as a vacuum layer, and it prevents heat invasion into the helium containers 203, 204 with the heat shield plate 209.

Figure 2:
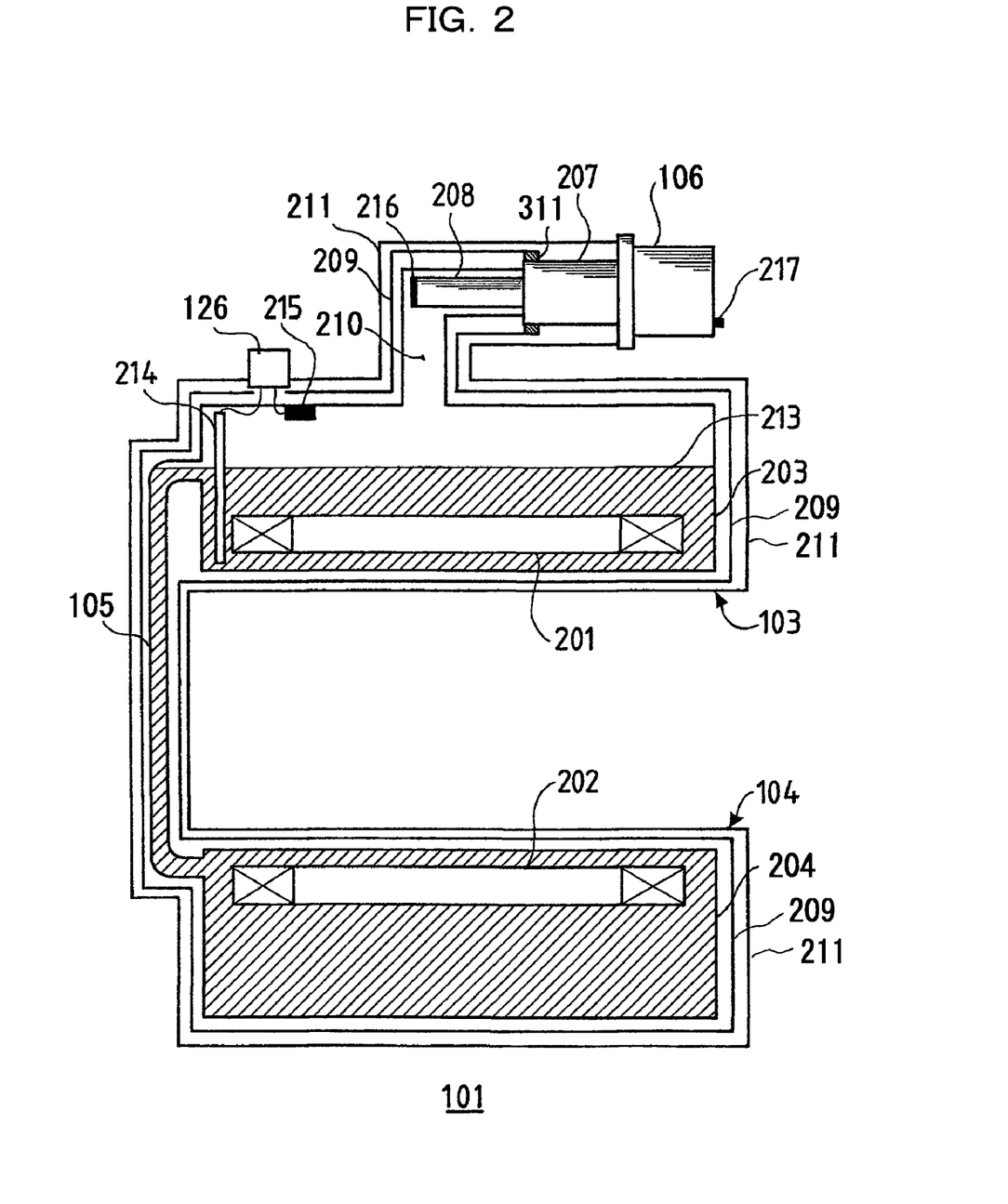
FIG. 2 is a diagram showing the cross-section of a superconducting magnet constituting the MRI apparatus of FIG. 1.

As shown in FIG. 2, the super conducting coil 201, 202 is accommodated in the helium containers 203, 204 of the upper cryostat 103, the lower cryostat 104 as shown in FIG. 2, thereby generating a static magnetic field in the imaging space. The magnetic field intensity of the static magnetic field is equal to 0.7 tesla at the center of the imaging space, and the uniformity of the magnetic field is equal to 3 ppm or less in a spherical space of 40 centimeters in diameter.

In FIG. 2, each superconducting coils 201, 202 is disposed in each of the upper and lower cryostats 103, 104. However, plural superconducting coils are ordinarily arranged in combination with one another to enhance the magnetic field intensity and the magnetic field uniformity and lower the intensity of leaking magnetic field.

A joint pipe 105 is disposed between the upper cryostat 103 and the lower cryostat 104, and connects the inner space of the upper helium container 203 and the inner space of the lower helium container 204. Under the normal state, via the joint pipe 105, the lower helium container 204 is perfectly filled with refrigerant (liquid helium), the upper helium container 203 is filled with liquid helium to the extent that the superconducting coil 201 is immersed in the liquid helium and the liquid level 213 of the refrigerant is located inside the upper helium container 203 as shown in FIG. 2. Furthermore, the superconducting coils 201, 202 disposed at the upper and lower sides are electrically connected to each other.

As shown in FIG. 2, a liquid level sensor 214 for measuring the liquid level 213 of liquid helium is inserted in the upper helium container 203. A pressure sensor 215 for measuring the pressure (the relative value to the atmosphere pressure) in the space filled with helium gas above the liquid level 213 is fixed at the upper portion of the inner wall surface of the upper helium container 203.

The output wires of the liquid level sensor 214 and the pressure sensor 215 are drawn out to the outside via a service port 126 provided to the upper cryostat 103, and connected to the cryo control unit 127. The cryo control unit 127 receives the liquid level position data and the pressure data.

Figure 3:
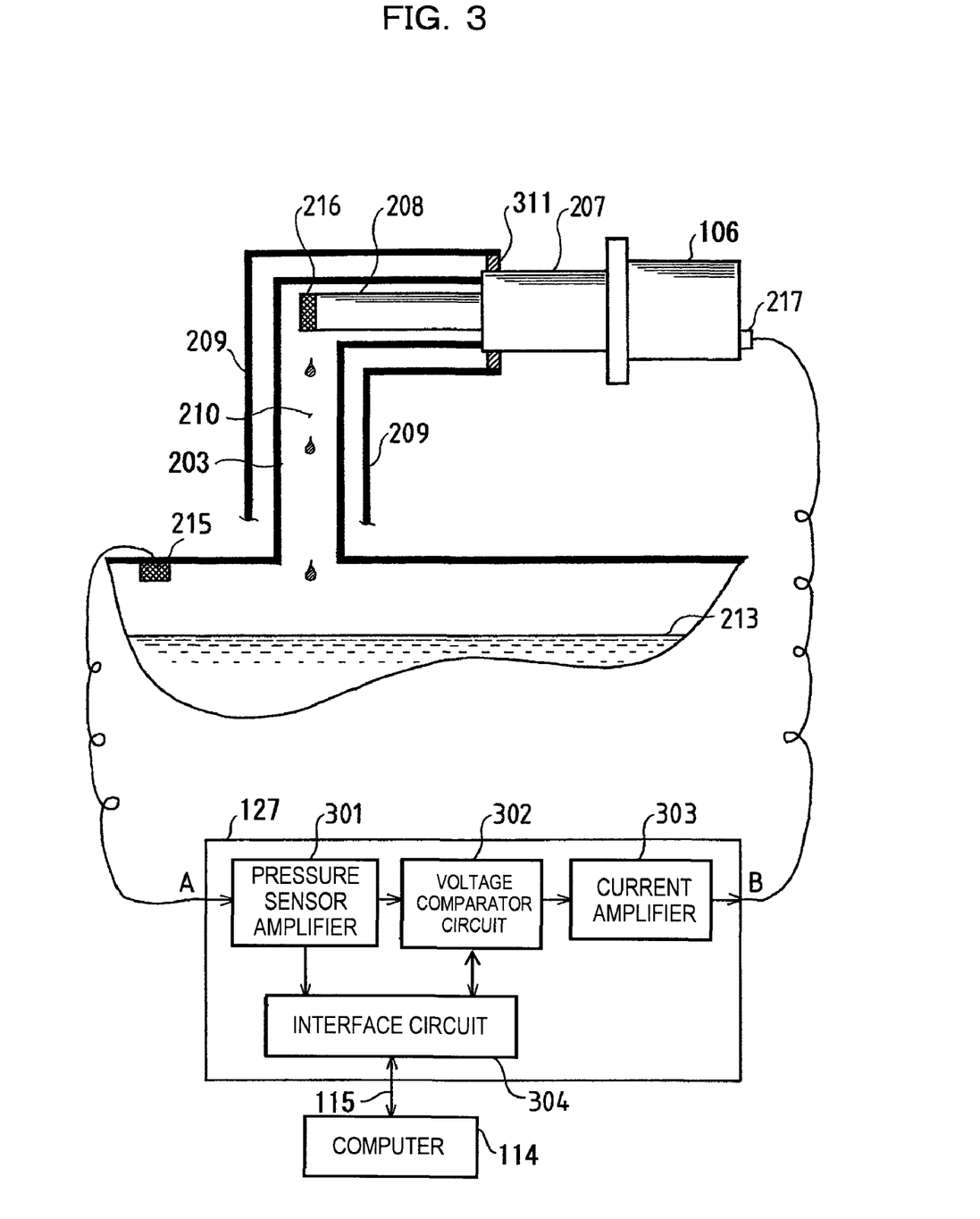
FIG. 3 is a diagram showing the constructions of a cryocooler 106 and a cryocooler control unit of the MRI apparatus of FIG. 1 and the connection state thereof.

Furthermore, as shown in FIGS. 2 and 3, an L-shaped vapor stock pipe 210 is disposed at the upper portion of the upper cryostat 103. The vapor stock pipe 210 is designed to have a multilayered structure containing the vacuum container 211, the heat shield plate 209 and the helium container 203 as in the case of the cryostat 103. The tip portion of the cryocooler 106 (first stage 207, second stage 208) is inserted in the vapor stock pipe 210.

As shown in FIG. 1, the cryocooler 106 is connected to the compressor unit 107, and supplied with compressed helium gas. In the process of movement via the first and second stages 207, 208 packed with cool storage material in the cryocooler 106, the supplied compressed helium gas expands, and the temperature thereof is reduced, so that the cool storage material is gradually cooled. In the first embodiment of the present invention, a cool storage material of slugs are packed in the first stage 207, and a cool storage material of holmium copper compound ($HoCu_2$) is packed in the second stage 208. The outer case of the first stage 207 is cooled to 50° Kelvin, and the outer case of the second stage 208 is cooled to 3.7° Kelvin.

The outer case of the first stage 207 is brought into thermal contact with the heat shield plate 209 of the upper cryostat 103, and it is cooled to 50° Kelvin to suppress invasion of radiation heat at maximum. A material having excellent thermal conduction, for example, an indium wire 311 is sandwiched between the contact surfaces of the outer case of the first stage 207 and the heat shield plate 209, whereby excellent thermal conduction between the contact surfaces is implemented.

The outer case of the second stage 208 is located in the inner space of the vapor stock pipe 210, and it has a function of directly cooling helium gas vaporized in the cryostat 103 and stocked in the vapor stock pipe 210 to its boiling point (4.2° Kelvin) or less so that helium gas is returned to liquid helium.

As shown in FIGS. 2 and 3, a cartridge heater 216 is secured to the tip of the second stage 208 of the cryocooler 106. The cartridge heater 216 heats the second stage 208 to reduce the cooling capacity, thereby increasing the pressure of the inner space of the cryostat 103. In the cartridge heater 216, the power supply wire thereof is drawn out to the outside via a connector 217 disposed on the base portion of the cryocooler 106, and connected to the cryo control unit 127.

The cryo control unit 127 controls the operation of the cartridge heater 216 in accordance with the pressure detected by the pressure sensor 215, and controls the pressure of the inner space to a desired value. The operation of the cryo control unit 127 will be described in detail later.

As shown in FIG. 1, the gradient magnetic field coil 108 is disposed at each imaging space side of the upper and lower cryostats 103, 104 of the superconducting magnet 101. The gradient magnetic field coil 108 is designed to have a flat surface structure so that it does not obstruct the open structure of the superconducting magnet 101, and has x, y, z coils (not shown).

Gradients in the magnetic field are generated in three axial directions perpendicular to one another by the x, y, z coils of a pair of upper and lower gradient magnetic field coils 108. For example, when current is applied to the z coil at the upper side and the z coil at the lower side, the upper z coil generates a magnetic flux in the same direction as a magnetic flux generated by the superconducting magnet 101, and the lower z coil generates a magnetic flux whose direction is different from that of the lower z coil by 180°.

As a result, a gradient in which the magnetic flux density is gradually reduced from the upper side to the lower side in the vertical axis (Z axis) of the imaging space is created. Likewise, the x coil and they coil generate gradients along the x-axis and the y-axis with respect to the magnetic flux density of the magnetic field generated by the superconducting magnet 101.

A gradient magnetic field power amplifier 109 supplies current to each of the x coil, the y coil and the z coil of the gradient magnetic field coil 108 independently of each other for only a desired time. Accordingly, the nuclear spins of an examination site of the object 102 are labeled with three-dimensional position information.

High-frequency coils 110 are installed at the imaging space side of the gradient magnetic field coil 108. A coil having a flat-plate structure is adopted as the high-frequency coils 110 so that it does not obstruct the open structure of the superconducting magnet 101. The pair of upper and lower high frequency coils 110 are supplied with high-frequency current corresponding to the resonance frequency of the nuclear spins by a high-frequency power amplifier 111, and the high-frequency magnetic field is applied to the object 102 of the imaging space, whereby the nuclear spins are substantially uniformly resonantly excited.

For example, high-frequency magnetic field of 29.8 mega heltzs which makes hydrogen atomic nucleus induce magnetic nuclear resonance at magnetic field intensity of 0.7 tesla is irradiated. By combining the gradient magnetic field and the above high-frequency magnetic field, the hydrogen atomic nuclear spins at a specific position can be selectively resonantly excited.

The detection coil 112 is disposed in the neighborhood of the examination site of the object 102. The detection coil 112 receives an NMR signal emitted via the magnetic motion of the nuclear spins, and converts the NMR signal to an electrical signal. The NMR signal which is converted to the electrical signal is input to a high-frequency amplifying unit 113 to be amplified, and then converted to a digital signal suitable for computer processing.

The computer 114 controls the operation of the gradient magnetic field power amplifier 109, the high-frequency power amplifier 111 and the high-frequency amplifying unit 113 at a predetermining timing. For example, a pulse sequencer (not shown) installed in the computer 114 outputs a signal via a system signal line 115 to the gradient magnetic field power amplifier 109, the high-frequency power amplifier 111 and the high-frequency amplifying unit 113 to execute a desired image pickup pulse sequence, thereby picking up images of the object 102.

The computer 114 executes conversion processing on the NMR signal converted to the digital signal to obtain a spectrum and an image to be provided to diagnosis, and then it saves the spectrum and the image into a memory device (not shown) in the computer 114 and displays them on a display 116.

Furthermore, the computer 114 monitors the operation state of the MRI apparatus, for example, the pressure in the cryostats 103, 104 and the value of the liquid level 213 of liquid helium via the cryo control unit 127 or the like at all times or at a constant time interval, records the state thereof and displays the state on the display 116. In addition, the computer 114 transmits these values via a communication control device 119 to a remotely monitoring external computer. The electromagnetic shield 117 and the filter circuit 118 shields electromagnetic wave noises generated by the computer 114, etc. to prevent the electromagnetic wave noises from reaching the detection coil 112.

Next, the construction and operation of the cryo control unit 127 will be described with reference to FIGS. 3 to 6.

As shown in FIG. 3, the cryo control unit 127 has a pressure sensor amplifier 301, a voltage comparator circuit 302, a current amplifier 303 and an interface circuit 304. The output signal A of the pressure sensor 215 is input to the pressure sensor amplifier 301.

The pressure sensor amplifier 301 amplifies the input signal to a required level, and executes code conversion for displaying the value of the pressure with a numerical value. The amplified signal voltage is input to the voltage comparator circuit 302, and the difference thereof from a preset reference voltage is calculated. The calculated differential voltage is input to and amplified by the current amplifier 303, and supplied as current B from the output terminal of the cryo control unit 127 via a connector 217 to a cartridge heater 216.

Here, the voltage comparator circuit 302 is actuated so that the current B is reduced when the value of the output signal A of the pressure sensor 215 is high. That is, when the pressure of helium gas in the upper space of the cryo stat 103 is high, and the heat value of the cartridge heater 216 is reduced, the surface temperature of the outer case 208 at the second stage of the cryocooler 106 is lowered to enhance cooling liquefaction of helium gas, thereby reducing the helium gas pressure of the upper helium container 203. That is, the cryo control unit 127, the pressure sensor 215 and the heater cartridge 216 constitute a feedback control loop via helium gas.

This feedback control will be described in detail. Radiation heat from the surfaces of the cryostats 103, 104 and conductive heat from the support portions of the superconducting coils 201, 202 which are not shown in FIG. 2 immerses into the cryostats 103, 104 as invading heat from the outside. For example, when this heat invasion is equal to 200 milliwatts, this heat value vaporizes liquid helium of 0.25 liters per hour and converts it to helium gas of 175 liters.

With respect to the cooling capacity of the cryocooler 106, a cooling capacity having a margin with respect to the heat invasion amount is adopted, and for example, it has 400 milliwatts under normal operation. This cooling capacity condenses helium gas of 350 liters to liquid helium of 0.5 liter per hour. Therefore, the pressure at the upper side of the liquid level 213 of liquid helium in the upper helium container 203 is gradually reduced every differential value (175 liters) between helium gas of 175 liters per hour generated due to infiltrating heat of 200 milliwatts and helium gas of 350 liters per hour condensed by the cooling capacity of 400 milliwatts of the cryocooler 106.

Therefore, the cryo control unit 127 makes current flow via the cartridge heater 216 installed at the tip of the cryocooler 106 to generate a heat value of 200 milliwatts so that the cooling capacity of the cryocooler 106 is substantially equal to 200 milliwatts. By performing this control, vaporization of liquid helium by the infiltrating heat of 200 milliwatts and condensation of helium gas by the cooling capacity of 200 milliwatts are balanced with each other in the upper and lower helium containers 203, 204, and thus constant pressure, for example, 1 psi can be kept.

The cryo control unit 127 is connected to the computer 114 via the interface circuit 304 so that it can set a numerical value display signal of the pressure sensor amplifier 301 and a reference voltage of the voltage comparator circuit 302. With this construction, an operator can monitor the internal pressure of the upper space of the upper helium container 203, and also can suitably set the optimum reference voltage in conformity with the characteristics of the cryostats 103, 104 of the superconducting magnet 101 and the cryocooler 106.

Figure 4:
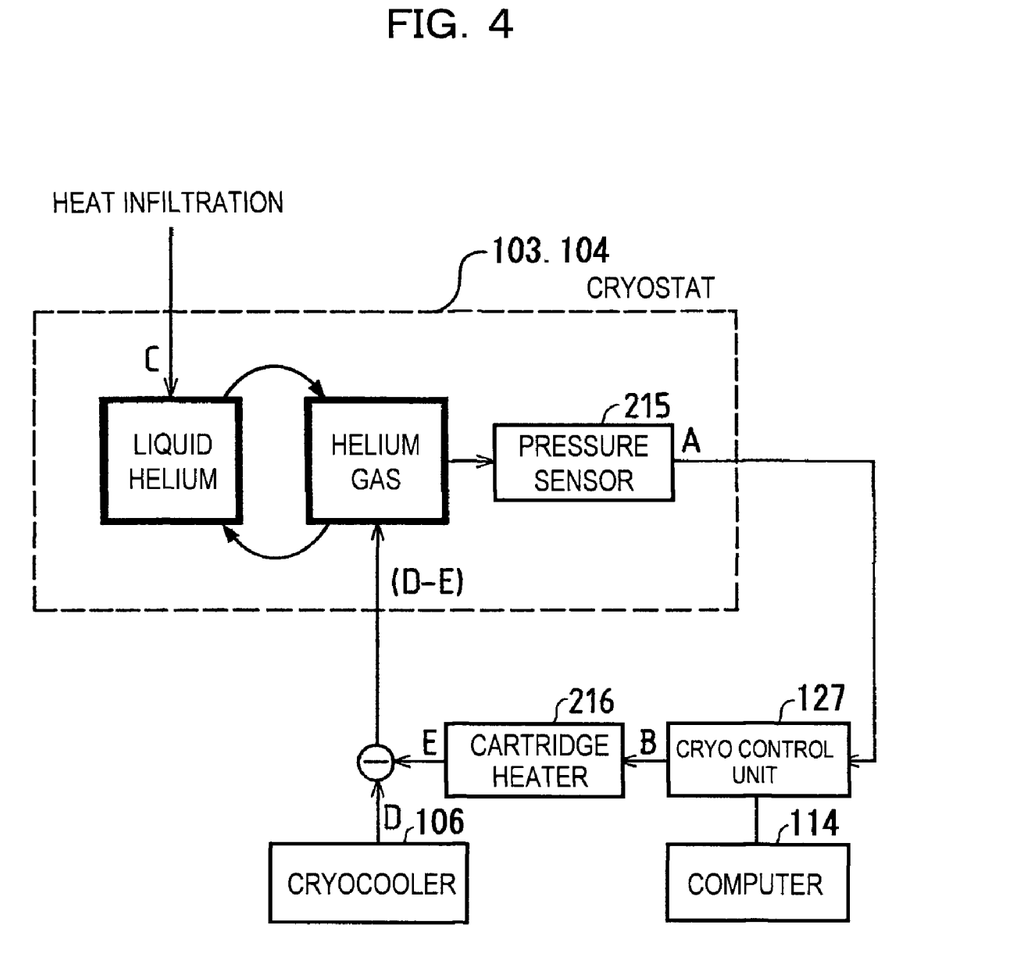
FIG. 4 is a diagram showing a feedback loop for controlling cryostats 103, 104 of the MRI apparatus of FIG. 1 and the pressure thereof.

Next, the function of the feedback control loop of the cryo control unit 127 will be described in detail with reference to FIG. 4. In FIG. 4, the total infiltrating heat C of the above radiation heat and the conductive heat via the structuring material of the cryostats are applied to the upper helium container 203 and the lower helium container 204 of the cryostats 103, 104. This heat value C serves as vaporization heat to change liquid helium to helium gas.

The cooing heat (D-E) of the difference between the cooling capacity D of the cryocooler 106 and the heat value E of the cartridge heater 216 acts on helium gas to change helium gas to liquid helium. When helium gas is condensed to liquid helium, the volume of helium is reduced to $1/700$. Therefore, the pressure of the upper helium container 203 is determined by the density of helium gas because increase/decrease of liquid helium can be neglected.

The pressure of the upper helium container 203 is detected by the pressure sensor 215, and the output signal A thereof is supplied to the cryo control unit 127. The cryostat control unit 127 controls the current value B of the cartridge heater 216 in accordance with the pressure signal. Via this control, the infiltrating heat value C is made to be equal to minus (D-E), that is, the vaporization amount of liquid helium and the condensation amount of helium gas are equal to each other and the pressure of the upper helium container 203 can be kept substantially fixed.

The signal of the interface circuit 304 of the cryo control unit 127 is supplied to the computer 141 to record data and display the data for the operator.

Figure 5:
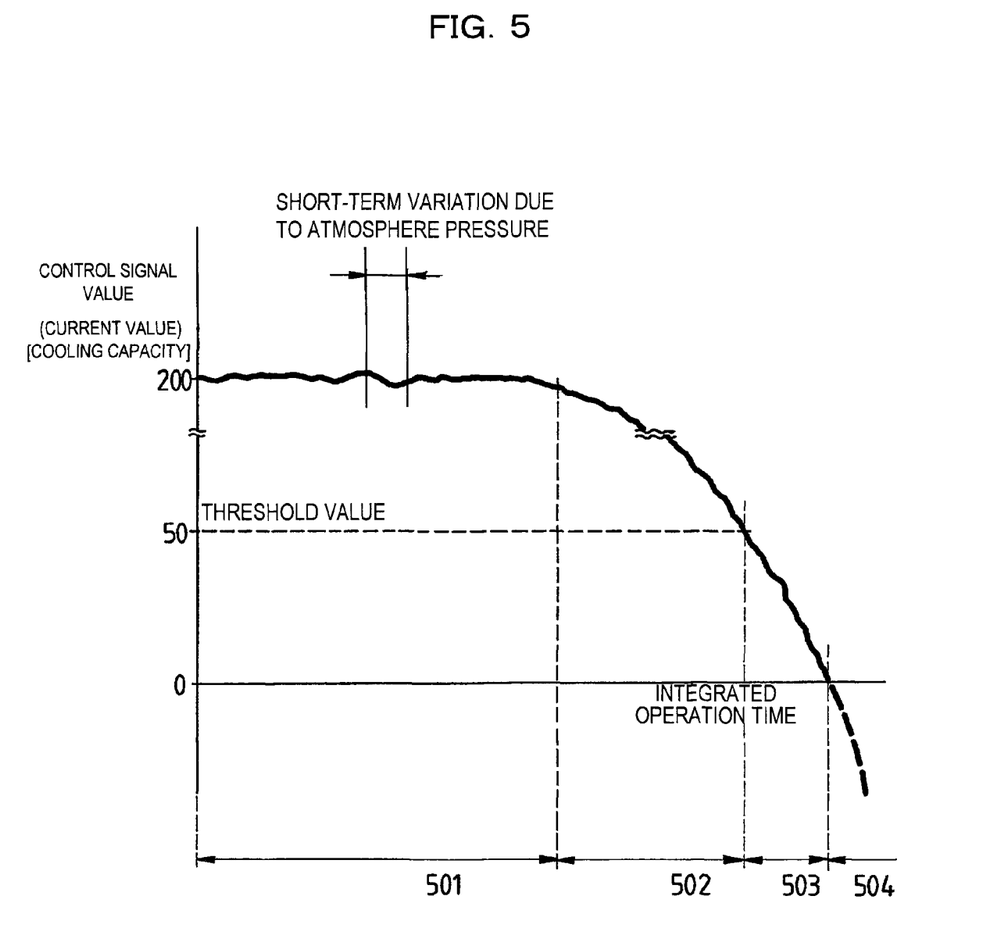
FIG. 5 is a graph showing that a control signal output from a voltage comparator circuit 302 varies with an integrated operation time in the cryo control unit 127 of FIG. 3.

In the feedback control loop as described above, when the operation time of the cryocooler 106 elapses and the cooling capacity thereof is lowered, the cryo control unit 127 controls the current value so as to lower the heat value E of the cartridge heater 216 in accordance with the reduction of the cooling capacity as shown in FIG. 5. Finally, when the cooling capacity D of the cryocooler 106 is equal to the heat value C infiltrating from the external, the current applied from the cryo control unit 127 to the cartridge heater 216 is equal to zero.

When the maintenance of the cryocooler 106 is delayed and the time further elapses, the cooling capacity D of the cryocooler 106 is reduced to be lower than the infiltrating heat value C. All helium gas to which liquid helium is vaporized is not condensed, and trapping of helium gas in the upper helium container 203 is started, thereby increasing the pressure thereof. Under such a state, the cryostat control unit 127 outputs a signal for setting the current of the cartridge heater 216 to minus.

In the first embodiment of the present invention, the control signal of the voltage comparator circuit 302 for controlling the current applied to the cartridge heater 216 is taken into the computer (judging unit) 114 via the interface circuit 304 to record and display the control signal, and judgment processing is executed on the basis of a predetermined program, thereby executing the processing of reporting necessity of execution of the maintenance of the cryocooler 106 to the operator at a suitable timing.

The judgment processing executed by the computer 114 will be described with reference to the flowchart of FIG. 6. A program is stored in a built-in memory of the computer 114 in advance, and the computer 114 reads and executes this program to operate as shown in the flowchart of FIG. 6.

Figure 6:
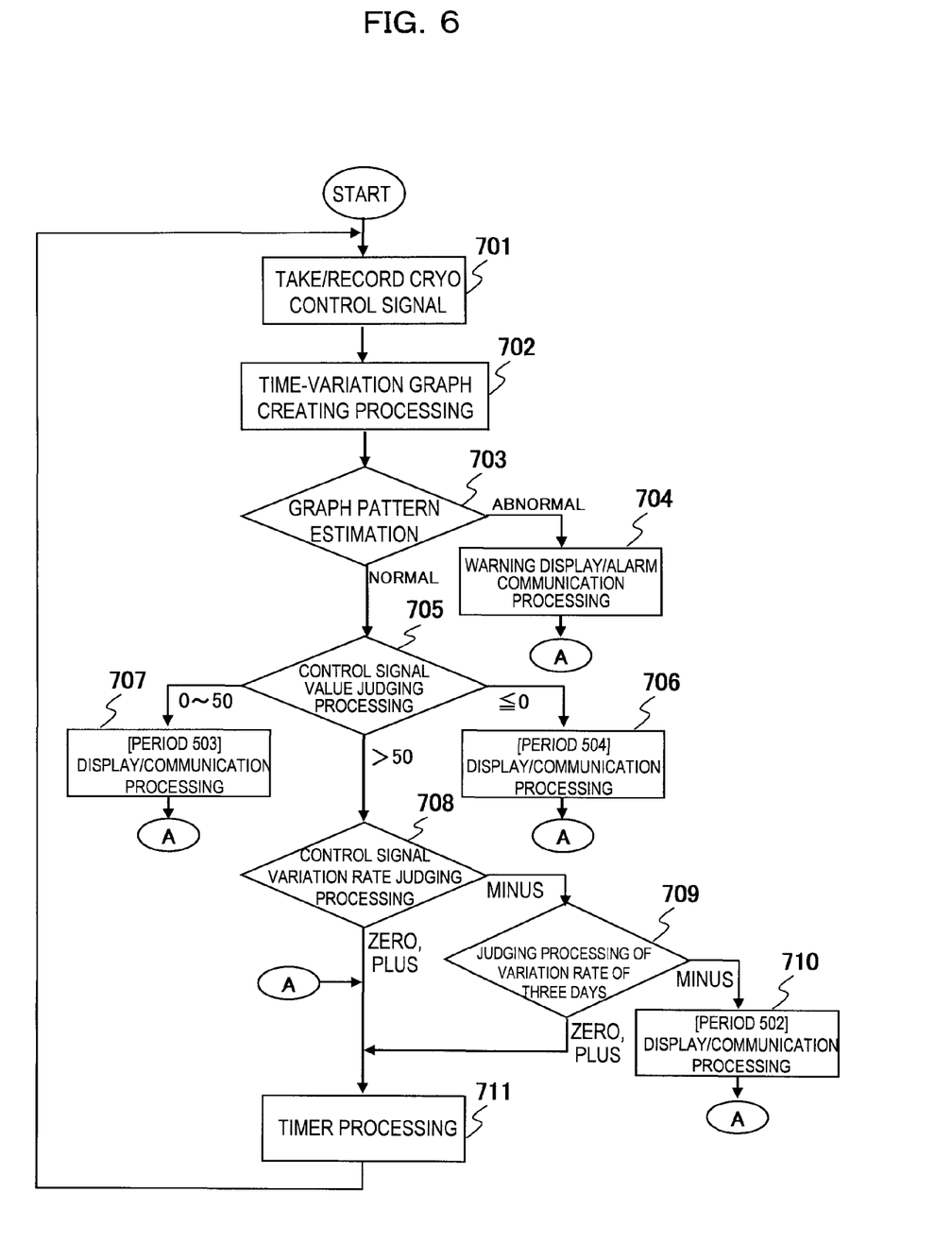
FIG. 6 is a flowchart showing a processing operation of a computer 114 which takes a signal of the cryo control unit 127 of FIG. 3.

In FIG. 6, when the MRI apparatus is started, the computer 114 takes a control signal which is output to the current amplifier 303 by the voltage comparator circuit 302 of the cryo control unit 127, and records it into a storage device in the computer 114 (step 701). With respect to the control signal value recorded in the storage device, a graph in which the read-in time (may be only month and day) is set on the abscissa axis and the signal value is set on the ordinate axis is plotted (step 702). This control signal is amplified in the current amplifier 303, whereby it becomes driving current to be supplied to the heater cartridge 216 and corresponds to the current value of the driving current.

In the case of a cryocooler operating normally, the graph plotted in step 702 exhibits a pattern that the control signal value (current value) is substantially fixed during a period (501) when the operation time is short, and the control signal value is gradually reduced with lapse of the operation time as shown in FIG. 5.

However, in the case of a trouble of the main body of the cryocooler 106 or a fixing failure, the graph exhibits a pattern different from the pattern shown in FIG. 5. For example, when the cooling capacity is low, the control signal value is low although the operation time is short. Alternatively, when the stability of the cooling capacity is low, the variation of the control signal value fluctuates more greatly than the variation of the ambient air temperature.

Therefore, the deviance between the pattern of the graph up to the present time point and a predetermined normal pattern is calculated to judge whether the cryocooler 106 is normal or abnormal (step 703). If it is judged that the cryocooler 106 is abnormal, communication such as a service call or the like is immediately made via the communication controller 119 such as a modem, a LAN terminal or the like, and also a warning is displayed on the display 116 or an alarm sound is generated (step 704).

When the pattern of the graph plotted in step 702 is normal, the processing shifts to the judgment of the control signal value (step 705). In this step 705, when the control signal value is equal to zero or less, it indicates that the cooling capacity of the cryocooler 106 is lower than the heat value infiltrating into the cryostat.

That is, it indicates that the time enters the period 504 for which rapid exchange and maintenance of the cryocooler 106 shown in FIG. 5 is required. Therefore, a display notifying necessity of rapid exchange and maintenance is displayed on the display 116, and also a request for rapid exchange and maintenance is transmitted via the communication controller 119 to a service center (step 706).

On the other hand, if the control signal value is not more than a value set as a threshold value, for example, it is equal to 50 or less in step 705, it indicates that the cryocooler 106 enters the proper period of the normal exchange and maintenance indicated by the period 503 of FIG. 5. Therefore, it is displayed on the display 116 that the currently installed cryocooler 106 is under the proper period 503 of the normal exchange and maintenance, and also a request for the normal exchange and maintenance is transmitted via the communication controller 119 to the service center (step 707).

Furthermore, if it is determined in step 705 that the control signal value is equal to the threshold value or more, for example, 50 or more, the variation rate of the recorded control signal value is calculated by the calculation processing (step 708). When the variation rate is minus, that is, when the graph shown in FIG. 5 exhibits a trend downwardly-sloping to the right, the average value of the variation rates over the previous several days, for examples, for three days, is calculated in order to exclude a short-term variation due to fluctuation of the external pressure (step 709).

When the average of the variation rates for three days is minus, the currently installed cryocooler 106 enters the period 502 in which the cooling capacity of the cryocooler 106 starts to be attenuated. Therefore, an indication for notifying that it is the period for planning the exchange and maintenance of the cryocooler is displayed on the display 116, and also a similar notification is transmitted to the service center (step 710).

In step 710, the timing at which the time reaches the proper period 503 of maintenance is estimated on the basis of the variation rate of the graph, and it can be also displayed on the display 116. For example, the variation rate of the graph is fitted to a predetermined standard graphic shape to draw a future estimated curved line of the graph, whereby the timing at which the time reaches the proper period 503 for maintenance can be predicted and announced in advance, or it may be adopted to merely add a predetermined number of days to a day when the time initially enters the period 502 and set the day corresponding to the addition result as the timing at which the time reaches the proper period 503 for maintenance.

If the average variation rate of three days is equal to zero in step 709, the probability that the present minus variation rate is affected by the ambient pressure is high, and an indication that the cryocooler 118 is under a period 501 for which the maintenance of the cryocooler 118 is unnecessary at present is displayed on the display 116.

With respect to the measurement of attenuation of the performance of the cryocooler 106, it is sufficient to carry out the measurement on a day basis. Therefore, for example, it is measured by a timer whether 24 hours elapses from the previous measurement, and if it is within 24 hours, the reading and recording processing of the cryo control signal and the judgment program falls into a standby state (step 711). If 24 hours elapse, the processing returns to step 701.

After the processing of the steps 704, 706, 707, 710 which executes each status display of the cryocooler 106 and the communication processing to the service center, all the processing jumps to this standby processing (step 711). This is because the image pickup function (clinical examination function) of the MRI apparatus can be properly operated even if the maintenance and exchange of the cryocooler 108 is rapidly required.

That is, the present status of the cryocooler 106 is notified to the operator by a display or an alarm, and also if a service call is executed by communication, it is unnecessary afterward to stop the MRI apparatus itself or the like, and it is set to be usable for clinical examination. Thereafter, the schedule of the normal clinical examination and the schedule of the maintenance and exchange of the cryocooler 106 are adjusted, whereby the maintenance and exchange of the cryocooler 106 is executed at a proper timing so that the maintenance and exchange and the clinical examination compete with each other.

Figure 7:
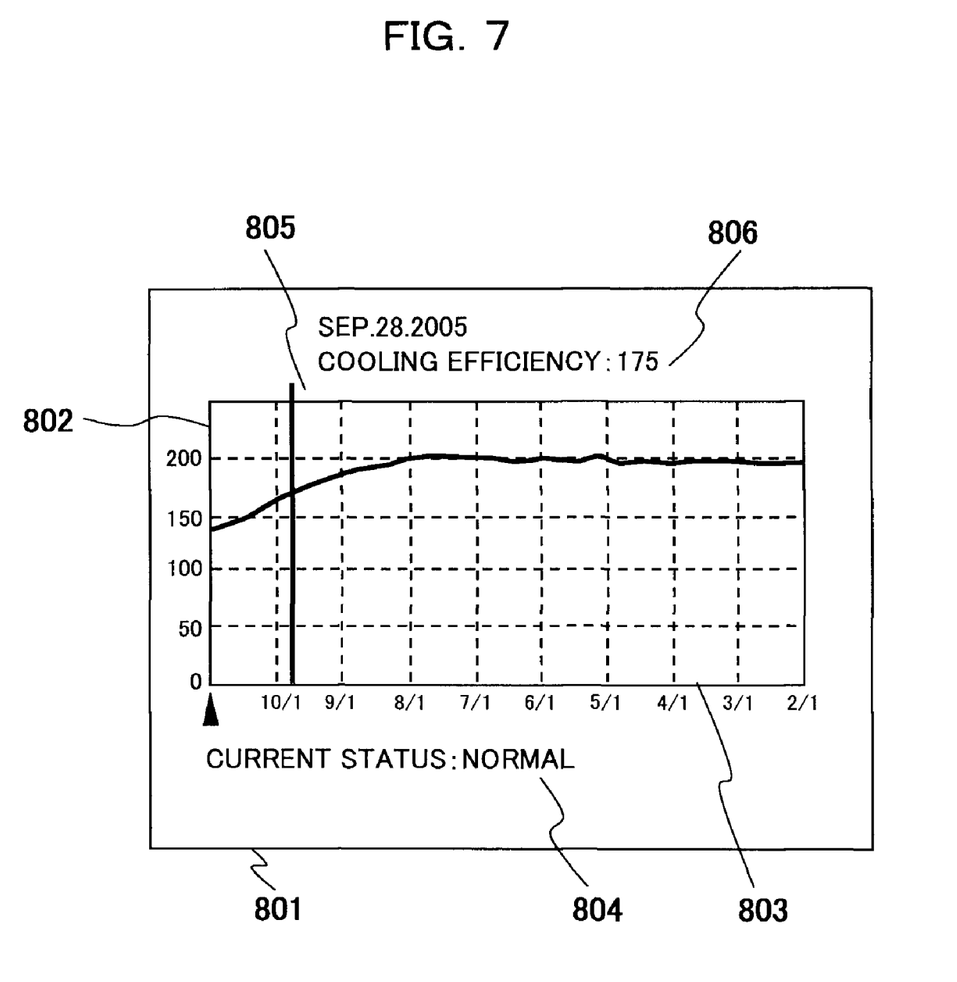
FIG. 7 is a graph showing the relationship between the control signal value to a heater and the integrated operation time with lapse of time and shows a screen example displayed on a display.

FIG. 7 is a diagram showing a screen example 801 displaying the graph created in step 702 on the display 116. FIG. 7 shows an X-Y graph in which the recording data of the cooling capacity of the cryocooler 106 are set on the ordinate axis 802 and the month and day are set on the abscissa axis 803.

The measurement value nearest to the display time is displayed at the left end of the X-Y graph at all times, and at the same time the present state 804 as a result of the judgment processing (steps 705, 708, 709 of FIG. 6) is also shown (in the example of FIG. 7, a normal state is shown). The displayed data are renewed every time the take-in and recording (step 701 of FIG. 6) processing of the cryo control signal, the latest data are displayed at the left end at all times and data of past nine months are displayed in the graph.

Accordingly, the operator of the MRI apparatus can not only easily judge the present operation status of the MRI apparatus, but also grasp the time-based variation of the cryocooler 106. Accordingly, the operator can deal with the future situation. Furthermore, the operator can move a cursor line 805 on the graph, and read out and display data 806 of a past specific date, for example, Sep. 28, 2005.

As described above, the computer 114 operates along the flowchart of FIG. 6, whereby the necessity of the check of the performance and maintenance of the cryocooler 108 can be judged by using the graph showing the variation of the control signal value in connection with the time lapse of the integrated operation time shown in FIG. 5.

According to the first embodiment of the present invention, by using the magnitude and variation amount of the control value (the current value in this embodiment) corresponding to the magnitude of the heat value of the cartridge heater 216, it is judged whether the maintenance of the cryocooler 106 is necessary or not. Therefore, the cooling capacity can be kept in a proper range and stable magnetostatic field can be generated irrespective of the performance dispersion of each cryocooler.

Furthermore, according to the first embodiment of the present invention, as compared with a case where the performance, etc. of the cryocooler 108 are judged by using only the cryo control signal value at one time point, the judgment can be more accurately performed, and the degree of the necessity of the maintenance and exchange can be also judged. In addition, there is an effect that the date of the maintenance and exchange can be determined by adjusting the optimum timing of the maintenance exchange and the schedule of the clinical examination.

Next, a second embodiment according to the present invention will be described. The first embodiment described above adopts the method of controlling the cooling capacity of the cryocooler 106 by the heat value of the cartridge heater 216 installed at the tip of the cryocooler 106. In the second embodiment of the present invention, a heater element 716 is installed in the upper helium container 203 or the lower helium container 204 in place of the cartridge heater 216.

In the case of the second embodiment, an electrically-heated wire, a ceramic heater or the like may be disposed as the heater element 716 in the helium containers 203, 204. However, the liquid level sensor 214 of liquid helium may be also used as the heater element 716. In this case, a wire rod formed of superconducting material is used as the liquid level sensor 214, for example. Current is made to flow via the superconducting wire rod, and the length of the wire rod below the liquid level is measured on the basis of the resistance value by utilizing the resistance of a portion immersed in liquid helium is equal to zero.

At this time, the wire rod is heated by making current flow via the wire rod, and thus the wire rod can be made to function as a heater element. The liquid level sensor 214 is made to serve as the heater element 716, whereby the system construction can be simplified.

The feedback control loop in the second embodiment of the present invention will be described with reference to FIG. 8.

Figure 8:
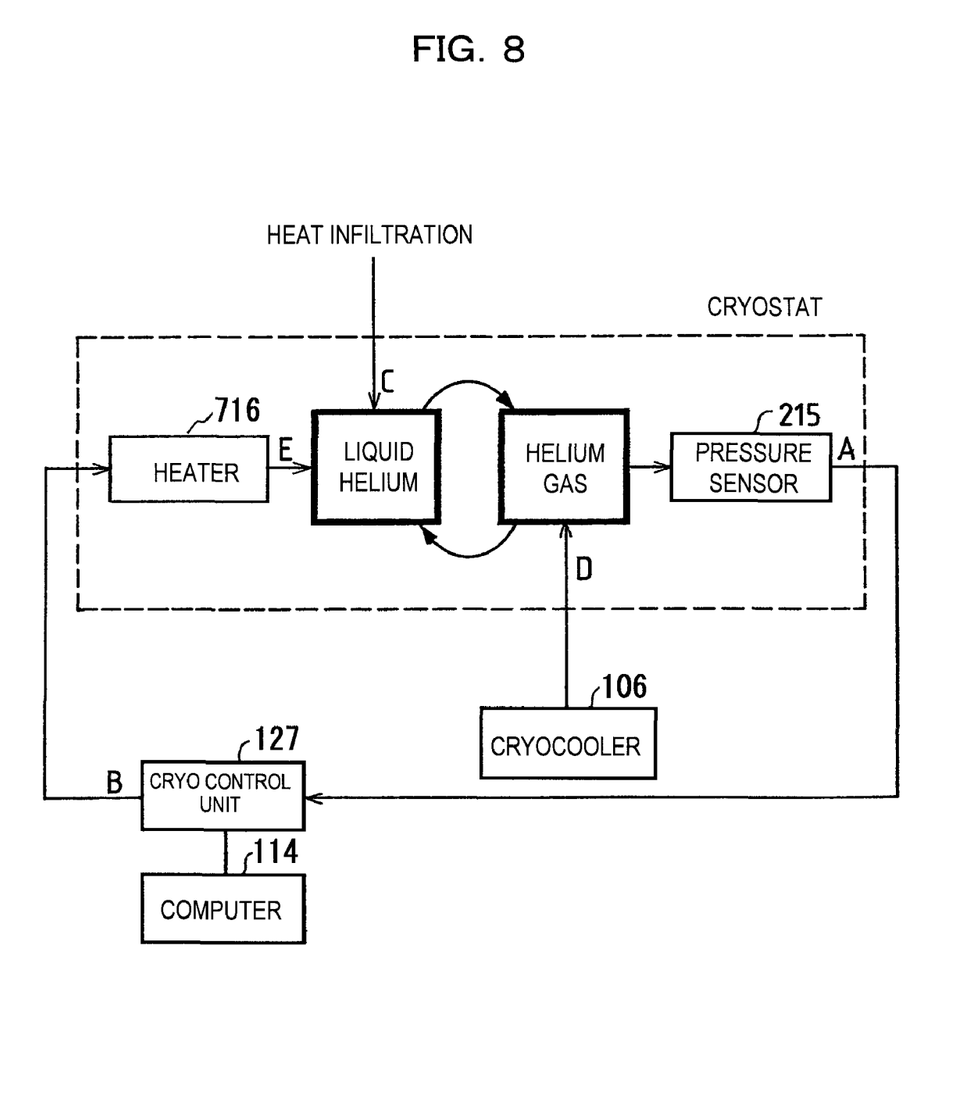
FIG. 8 is a diagram showing a feedback control loop in a second embodiment of the present invention.

In FIG. 8, the infiltrating heat C corresponding to the total of the radiation heat and the conductive heat via the structuring material is applied to the upper helium container 203 and the lower helium container 204 of the cryostats 103, 104 as described above. Furthermore, the heat value E generated by the heater element 716 installed in the helium container 203 or 204 is further applied. Accordingly, the heat values C+E vaporize liquid helium to helium gas.

On the other hand, the cooling capacity D of the cryocooler 106 acts on helium gas to return helium gas to liquid helium. The inner pressure of the upper helium container 203 is detected by the pressure sensor 215, and the pressure signal A thereof is supplied to the cryo control unit 127. The cryo control unit 127 controls the current value B which corresponds to the pressure signal A and is supplied to the heater element 716.

The control of the current value B is the control of balancing the total heat C+E with −D, that is, making the vaporization amount of liquid helium coincident with the condensation amount of helium gas, whereby the inner pressure of the upper helium container 203 is kept substantially fixed.

The other constructions are the same as the first embodiment, and thus the detailed description thereof is omitted.

According to the second embodiment of the present invention, the same effect as the first embodiment can be obtained, and also there is an effect that the system construction can be simplified by making the liquid level sensor serve as a heater element.

As described above, according to the present invention, even when the superconducting magnet has an open structure having much heat infiltration, the stable pressure control of the cryostats can be performed, and the proper maintenance execution timing of the cryocooler can be grasped. The method of the embodiment according to the present invention is not a complicated method of measuring the degradation of the cooling capacity of a refrigerating machine by directly disposing some circuit in the refrigerating machine, and thus this method is estimated as a simple method.

As a result, the maintenance of the cryocooler can be avoided from being delayed, and consumption of liquid helium can be kept substantially zero. Furthermore, the accurate timing for executing the maintenance of the cryocooler can be grasped in advance, and thus the maintenance can be executed in conformity with the user's use plan of the MRI apparatus.

Figure 9:
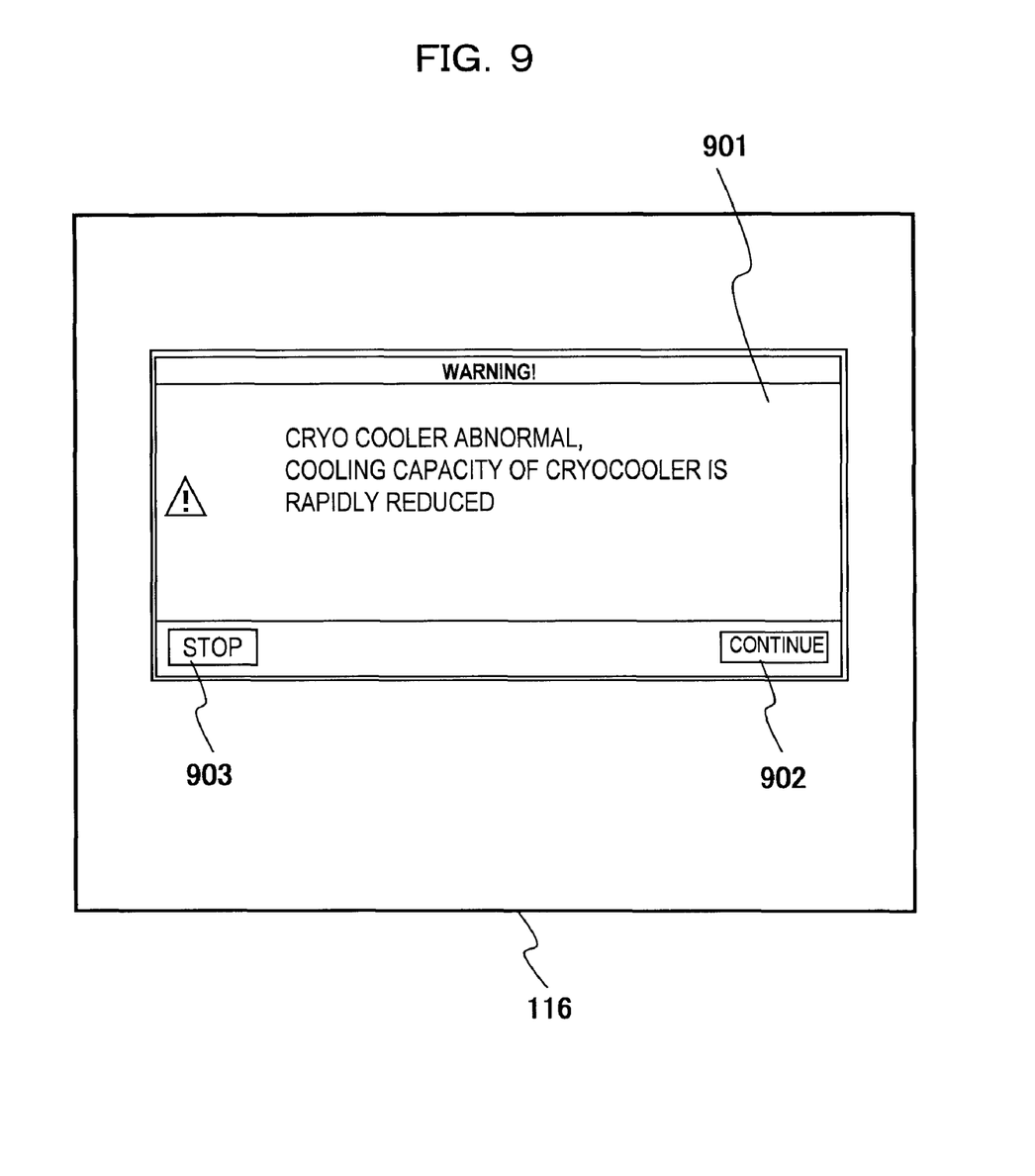
FIG. 9 is a diagram showing a display example of a warning display/alarm in the present invention.

Finally, FIG. 9 shows a display example of warning display/alarm in step 704 displayed on the display 116. In the embodiment of the present invention, it has been already described with reference to the flowchart of FIG. 6 that the judgment processing is automatically executed by the program installed in the computer 114 without monitoring the state of the cryocooler 106 at all times by the operator. For example, when the operator judges the judgment processing program as being abnormal during the operation of a normal examination mode of an object on the display 116, the operator immediately communicates a service call via the communication controller 119 such as a modem, a LAN terminal or the like, and the operator can get a scent of abnormality of the cryocooler because an alarm window (slave screen) 901 of FIG. 9 is displayed on the display 116. When a normal examination is continued in spite of the display of the alarm window 901, "Continue" 902 at the lower right side is clicked by a mouse or the like. Or, the present examination mode is temporarily interrupted, and "cease" 903 at the lower left side is clicked when shifting to the operation of displaying record data of the cooling capacity of the cryocooler 106 shown in FIG. 8, for example.

In the example described above, the control signal value shown in FIG. 5 and the time may be transmitted from the communication controller 119 to an external computer, whereby abnormality of the cryocooler 106, abnormality of the pressure sensor 215, etc. can be analyzed from the transmitted data (the control signal value and the time) at the external computer.

The invention claimed is:

1. A magnetic resonance imaging apparatus using a superconducting magnet, said magnetic resonance imaging apparatus comprising:
   a superconducting coil;
   a container for accommodating the superconducting coil together with refrigerant;
   a cooling unit for cooling and liquefying gas obtained by vaporizing the refrigerant in the container;
   a pressure detector for detecting a value of pressure in the container;
   a heating unit disposed in at least one of the cooling unit and the container;
   a controller for controlling a heat value of the heating unit and controlling the pressure in the container in accordance with the pressure value detected by the pressure detector; and
   a judging unit for judging, by using the heat value, whether maintenance of the cooling unit should be performed or not, wherein
   the controller outputs continuously a current control signal for the heating unit, and
   the controller determines a period for which maintenance of the cooling unit is required or a period for planning maintenance to be performed, by using a variation rate of the current control signal supplied from the controller to the heating unit, after the current control signal has been substantially constant for a period.

2. The magnetic resonance imaging apparatus according to claim 1, wherein the controller calculates a difference between the pressure value detected by the pressure detector and a predetermined pressure value, and controls the heating unit to generate the heat value corresponding to the calculated difference.

3. The magnetic resonance imaging apparatus according to claim 1, wherein the judging unit judges necessity or non-necessity of the maintenance of the cooling unit by using the heat value or variation of the heat value.

4. The magnetic resonance imaging apparatus according to claim 3, wherein the judging unit judges that it is necessary to perform the maintenance of the cooling unit when the heat value is reduced to a predetermined value or less.

5. The magnetic resonance imaging apparatus according to claim 3, wherein
   the judging unit announces beforehand that the maintenance of the cooling unit will be required when the variation of the heat value is out of a predetermined range.

6. The magnetic resonance imaging apparatus according to claim 5, wherein the judging unit estimates, based on the variation of the heat value, a timing at which the maintenance of the cooling unit is required.

7. The magnetic resonance imaging apparatus according to claim 5, wherein when the variation of the heat value is out of the predetermined range, the judging unit calculates variation of the heat value for a predetermined period and makes are judgment by using the calculated variation of the heat value in order to exclude a portion of the variation of the heat value due to atmosphere pressure.

8. The magnetic resonance imaging apparatus according to claim 1, wherein the judging unit uses as the heat value the current control signal to be supplied from the controller.

9. The magnetic resonance imaging apparatus according to claim 1, wherein the heating unit includes a liquid level measuring unit of the refrigerant.

10. The magnetic resonance imaging apparatus according to claim 1, further comprising a display unit, wherein the judging unit displays on the display unit information indicating necessity or non-necessity of maintenance of the cooling unit or outputs an alarm.

11. The magnetic resonance imaging apparatus according to claim 10, further comprising a display unit, wherein the judging unit uses the current control signal supplied from the controller to the heating unit as the heat value concerned and displays on the display unit information indicating time-variation of the current control signal concerned.

12. The magnetic resonance imaging apparatus according to claim 1, wherein the controller determines the period for which maintenance of the cooling unit is required or the period for planning maintenance to be performed, by using information that the variation rate of the current control signal has become negative.

13. The magnetic resonance imaging apparatus according to claim 1, wherein the controller determines the period for which maintenance of the cooling unit is required or the period for planning maintenance to be performed, by obtaining average value of the variation rate for a second predetermined period.

14. The magnetic resonance imaging apparatus according to claim 13, wherein the second predetermined period is a desired period in which short-term variation due to fluctuation of an external pressure can be excluded.

15. The magnetic resonance imaging apparatus according to claim 1, further comprising an output unit, wherein when the controller determines the period for which maintenance of the cooling unit is required or the period for planning maintenance to be performed, the output unit outputs information indicating said period for which maintenance of the cooling unit is required or said period for planning maintenance to be performed.

16. The magnetic resonance imaging apparatus according to claim 1, wherein the current control signal output by the controller becomes a signal that causes the current to the cooling unit to be zero, only when the controller determines that maintenance of the cooling unit is required.

17. A maintenance method for a magnetic resonance imaging apparatus using a superconducting magnet including a superconducting coil and a cooling unit for liquefying refrigerant, said method comprising:
   detecting a value of pressure in a container for accommodating the superconducting coil and refrigerant;
   outputting continuously by a controller of the magnetic resonance imaging apparatus a current control signal for a heating unit to control the heating unit disposed in at least one of the cooling unit and the container, to heat at a heat value corresponding to the detected pressure value, thereby controlling the pressure in the container;
   judging necessity or non-necessity of maintenance of the cooling unit by using the heat value; and
   determining a period for which maintenance of the cooling unit is required or a period for planning maintenance to be performed, by using a variation rate of the current control signal supplied from the controller to the heating unit, after the current control signal has been substantially constant for a period.

18. A storage medium storing a computer program of instructions executable by a computer to perform a method for judging necessity or non-necessity of maintenance of a cooling unit in a magnetic resonance imaging apparatus comprising a container for accommodating a superconducting coil together with refrigerant, a cooling unit for cooling and liquefying gas obtained by vaporizing the refrigerant in the container, a pressure detector for detecting a value of pressure in the container, a heating unit disposed in at least one of the cooling unit and the container, and a controller for controlling a heat value of the heating unit and controlling the pressure in the container in accordance with the pressure value detected by the pressure detector, said method comprising:
- (a) determining a graphical pattern of time-variation of the heat value of the heating unit;
- (b) calculating a deviance between the graphical pattern determined in (a) and a predetermined normal pattern;
- (c) determining based on the calculated deviance whether maintenance is required for the cooling unit;

wherein the method further comprises performing, when it is determined based on the calculated deviance that the maintenance of the cooling unit is unnecessary, the steps of:

determining whether the heat value is equal to a predetermined value or less;

displaying information indicating necessity of the maintenance of the cooling unit when the heat value is equal to or less than the predetermined value;

calculating a variation rate of the heat value when the heat value exceeds the predetermined value;

determining based on the calculated variation rate whether the maintenance of the cooling unit is necessary or not; and displaying information indicating necessity or non-necessity of maintenance.

* * * * *